US 6,686,640 B2

(12) United States Patent
Mheen et al.

(10) Patent No.: US 6,686,640 B2
(45) Date of Patent: Feb. 3, 2004

(54) VARACTOR HAVING IMPROVED Q-FACTOR AND METHOD OF FABRICATING THE SAME USING SIGE HETEROJUNCTION BIPOLAR TRANSISTOR

(75) Inventors: Bongki Mheen, Daejon (KR); Dongwoo Suh, Daejon (KR); Jin-Yeong Kang, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 87 days.

(21) Appl. No.: 10/044,107

(22) Filed: Jan. 11, 2002

(65) Prior Publication Data

US 2003/0052388 A1 Mar. 20, 2003

(30) Foreign Application Priority Data

Sep. 17, 2001 (KR) .......................... 2001-57175

(51) Int. Cl.[7] .............................................. H01L 29/93
(52) U.S. Cl. ........................................ 257/480; 257/595
(58) Field of Search ..................... 257/63, 197, 379, 257/474, 478, 583, 591–596, 598–601, 480

(56) References Cited

U.S. PATENT DOCUMENTS 6,172,378 B1    1/2001    Hull et al. ..................... 257/14

6,521,506 B1 *  2/2003    Coolbaugh et al. ......... 438/379

FOREIGN PATENT DOCUMENTS

KR    2000-0042703    7/2000    ............ H03B/5/08

OTHER PUBLICATIONS

IEEE, vol. 32, No. 9, Sep. 1999, "Integrated RF Compnents in a SiGe Bipolar Technology", J. Burghartz, et al., 6 pages.
IEEE, vol., 43, No. 9, Sep. 1996, "Integrated RF and Microwave Components in BiCMOS Technology", J. Burghartz, 12 pages.

* cited by examiner

Primary Examiner—Craig Thompson
(74) Attorney, Agent, or Firm—Blakely, Sokoloff, Taylor & Zafman

(57) ABSTRACT

A varactor includes a semiconductor substrate of a first conductivity type, a high-concentration buried collector region of a second conductivity type formed in an upper portion of the semiconductor substrate, a collector region of the second conductivity type formed on a first surface of the high-concentration buried collector region, a high-concentration collector contact region of the second conductivity type formed on a second surface of the high-concentration buried collector region, a high-concentration silicon-germanium base region of the first conductivity type formed on the collector region, a metal silicide layer formed on the silicon-germanium base region, a first electrode layer formed to contact the metal silicide layer, and a second electrode layer formed to be electrically connected to the collector contact region.

7 Claims, 10 Drawing Sheets

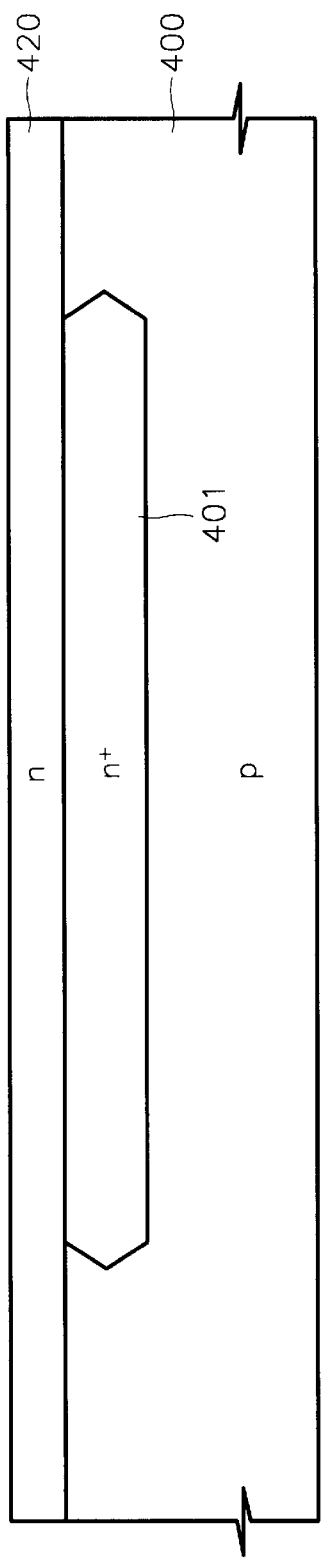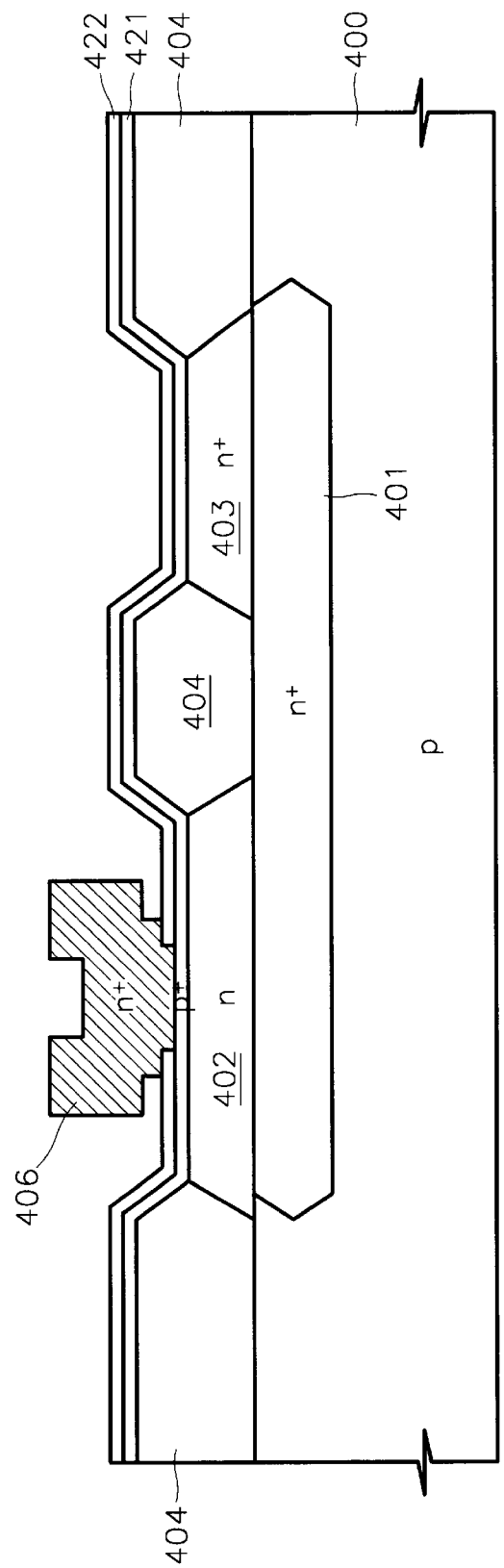

VARACTOR HAVING IMPROVED Q-FACTOR AND METHOD OF FABRICATING THE SAME USING SIGE HETEROJUNCTION BIPOLAR TRANSISTOR

BACKGROUND OF THE INVENTION

1. Field of the Invention

The present invention relates to a varactor having variable capacitance and a method of fabricating the same, and more particularly, to a varactor having an improved Q-factor and a method of fabricating the same using a silicon-germanium (SiGe) heterojunction bipolar transistor.

2. Description of the Related Art

Generally, varactors are devices whose reactance components vary with applied voltages or current sources, and more particularly, denote devices which change their reactance components using the fact that the width of a depletion area changes depending on the magnitude of reverse bias applied to a pn junction.

When varactors are used in fields requiring a high Q-factor, a resistance component parasitic on a variable reactance value should be maintained minimum in order to achieve excellent operating characteristics. Particularly, in designing voltage-controlled oscillators capable of varying oscillation frequency using control voltage, together with the Q-factor of an inductor, the Q-factor of a varactor is one of the essential factors influencing the Q-factor of a resonator in a voltage-controlled oscillator and the phase noise of an oscillation signal.

There has been proposed a technique using an accumulation mode and a depletion mode by using a gate oxide layer of a complementary metal-oxide semiconductor (CMOS) transistor in fabricating a varactor having a high Q-factor (J. N. Burghartz; IEEE Journal of Solid-State Circuits, Vol. 32, No. 9, 1997, pp1440–1445). However, disadvantageously, this method requires use of processes of fabricating a CMOS transistor or bipolar CMOS (BiCMOS) transistor in order to form a gate oxide layer of a CMOS transistor. Particularly, in the case of CMOS transistors, noise occurs on the interface between oxide layers due to structural problems, which increases the 1/f (frequency) noise of a device. As a result, the phase noise of a voltage-controlled oscillator increases.

Recently, a method of fabricating a varactor using a SiGe heterojunction bipolar transistor (HBT) has been highlighted. It has been widely known that a SiGe HBT achieves excellent performance by decreasing an energy band gap in a base region.

FIG. 1 is a sectional view of a typical SiGe HBT, particularly, a typical self-alignment type SiGe HBT. Referring to FIG. 1, an n$^+$-type buried collector region 101 is formed in the upper surface portion of a p-type substrate 100. An n-type collector region 102 and an n$^+$-type collector contact region 103 are formed on the n$^+$-type buried collector region 101 such that they are separated by an isolation layer 104. A p$^+$-type SiGe base region 105 is thinly formed on the n-type collector region 102 to extend over the isolation layer 104. An n$^+$-type polysilicon layer is formed on the surface of the p$^+$-type SiGe base region 105 and the surface of the n$^+$-type collector contact region 103. The n$^+$-type polysilicon layer on the p$^+$-type SiGe base region 105 is an n$^+$-type emitter region 106 and the n$^+$-type polysilicon layer on the n$^+$-type collector contact base region 103 is a collector conductive layer 107.

The p$^+$-type SiGe base region 105 electrically contacts a base electrode 109, the n$^+$-type emitter region 106 electrically contacts an emitter electrode 110, and the collector conductive layer 107 electrically contacts a collector electrode 111. A titanium silicide layer 112 is disposed between each of the regions 105, 106, and 107 and each of the electrodes 109, 110, and 111. The electrodes 109, 110, and 111 are insulated from one another by an insulation layer 113. Reference numeral 114 denotes an impurity region for isolating devices. Reference numeral 115 denotes a p$^+$-type external base region.

FIG. 2 is a sectional view of a varactor using the self-alignment type SiGe HBT of FIG. 1. In FIGS. 1 and 2, the same reference numerals denote the same regions or layers.

In comparison with the self-alignment type SiGe HBT of FIG. 1, an n$^+$-type emitter region 106 is electrically isolated from a p$^+$-type base region 105 by an insulation layer 113 to form a pn diode structure, and the emitter electrode 110 of FIG. 1 is eliminated. Accordingly, an n$^+$-type buried collector region 101 and a collector electrode 111 act as a cathode region and a cathode electrode, respectively. The p$^+$-type base region 105 and a base electrode 109 act as an anode region and an anode electrode, respectively.

However, in such a varactor, although the p$^+$-type base region 105 contacts the base electrode 109 with a titanium silicide layer 112 therebetween, a parasitic resistance component still exists, which may badly affects the Q-factor of a device. In addition, when a plurality of varactors are implemented in a multi-finger form, the n$^+$-type buried collector region 101 is necessarily longer in order to secure the area for connecting the bases of the adjacent varactors. As a result, collector serial resistance increases, thereby decreasing the Q-factor. Moreover, parasitic capacitance, which is formed by the overlap of the base region 105 and a collector region 102 due to an isolation layer 104, is connected to the intrinsic capacitance of the varactor in parallel, so entire capacitance increases.

SUMMARY OF THE INVENTION

To solve the above-described problems, it is a first object of the present invention to provide a varactor having an excellent Q-factor maintained using a silicon-germanium (SiGe) heterojunction transistor having a good phase noise characteristic.

It is a second object of the present invention to provide a method of fabricating the varactor.

To achieve the first object of the invention, in a first embodiment, there is provided a varactor including a semiconductor substrate of a first conductivity type, a high-concentration buried collector region of a second conductivity type formed in an upper portion of the semiconductor substrate, a collector region of the second conductivity type formed on a first surface of the high-concentration buried collector region, a high-concentration collector contact region of the second conductivity type formed on a second surface of the high-concentration buried collector region, a high-concentration silicon-germanium base region of the first conductivity type formed on the collector region, a metal silicide layer formed on the silicon-germanium base region, a first electrode layer formed to contact the metal silicide layer, and a second electrode layer formed to be electrically connected to the collector contact region.

Preferably, the varactor further includes a collector conductive layer and a metal silicide layer which are formed between the collector contact region and the second electrode layer. Here, the collector conductive layer may be a polysilicon layer doped with impurity ions of the second conductivity type at a high concentration.

Preferably, the varactor further includes a high-concentration external base region of the first conductivity type formed between the collector region and the silicon-germanium base region.

In a second embodiment, there is provided varactor including a semiconductor substrate of a first conductivity type, a high-concentration buried collector region of a second conductivity type formed in an upper portion of the semiconductor substrate, a collector region of the second conductivity type formed on a first surface of the high-concentration buried collector region, a high-concentration collector contact region of the second conductivity type formed on a second surface of the high-concentration buried collector region, a high-concentration silicon-germanium base region of the first conductivity type formed on the collector region, a conductive layer formed on the silicon-germanium base region, a metal silicide layer formed on the conductive layer, a first electrode layer formed to contact the metal silicide layer, and a second electrode layer formed to be electrically connected to the collector contact region.

Preferably, the conductive layer is a polysilicon layer doped with impurity ions of the second conductivity type at a high concentration.

Preferably, the varactor further includes a collector conductive layer and a metal silicide layer which are formed between the collector contact region and the second electrode layer. Here, the collector conductive layer may be a polysilicon layer doped with impurity ions of the second conductivity type at a high concentration.

To achieve the second object of the invention, in a first embodiment, there is provided a method of fabricating a varactor including the steps of forming a high-concentration buried collector region of a second conductivity type in an upper portion of a semiconductor substrate of a first conductivity type; forming a collector epitaxial layer of the second conductivity type on the semiconductor substrate having the buried collector region; forming a collector region and a collector contact region by separating the collector epitaxial layer using an isolation layer; forming a high-concentration silicon-germanium base epitaxial layer of the first conductivity type on the isolation layer, the collector region, and the collector contact region; forming a silicon-germanium base region formed only on an upper surface portion of the collector region by patterning the silicon-germanium base epitaxial layer; forming a metal silicide layer on the silicon-germanium base region; forming a first electrode layer to directly contact a surface of the metal silicide layer; and forming a second electrode layer to be electrically connected to the collector contact region.

Preferably, the step of forming the second electrode layer includes forming a collector conductive layer, which is doped with high-concentration impurity ions of the second conductivity type, on the collector contact region; forming a metal silicide layer on the collector conductivity layer; and forming the second electrode layer to directly contact a surface of the metal silicide layer.

In a second embodiment, there is provided a method of fabricating a varactor including the steps of forming a high-concentration buried collector region of a second conductivity type in an upper portion of a semiconductor substrate of a first conductivity type; forming a collector epitaxial layer of the second conductivity type on the semiconductor substrate having the buried collector region; forming a collector region and a collector contact region by isolating the collector epitaxial layer using an isolation layer; forming a high-concentration silicon-germanium base epitaxial layer of the first conductivity type on the isolation layer, the collector region, and the collector contact region; forming a nitride layer pattern on the silicon-germanium base epitaxial layer so that the surface of the silicon-germanium base epitaxial layer is partially exposed; forming a conductivity layer on the silicon-germanium base epitaxial layer; forming a silicon-germanium base region by removing the nitride layer pattern and patterning the silicon-germanium base epitaxial layer; forming a collector conductive layer on the collector contact region; forming a metal silicide layer on the silicon-germanium base region, the conductive layer, and the collector conductive layer; forming a first electrode layer to directly contact a surface of the metal silicide layer on the conductive layer; and forming a second electrode layer to directly contact a surface of the metal silicide layer on the collector conductive layer.

BRIEF DESCRIPTION OF THE DRAWINGS

The above objects and advantages of the present invention will become more apparent by describing in detail preferred embodiments thereof with reference to the attached drawings in which:

FIGS. 10 through 12 are sectional views of a varactor for explaining a method of fabricating the varactor according to a second embodiment of the present invention.

DETAILED DESCRIPTION OF THE INVENTION

Hereinafter, embodiments of the present invention will be described in detail with reference to the attached drawings. The present invention is not restricted to the following embodiments, and many variations are possible within the spirit and scope of the present invention.

Figure 3:
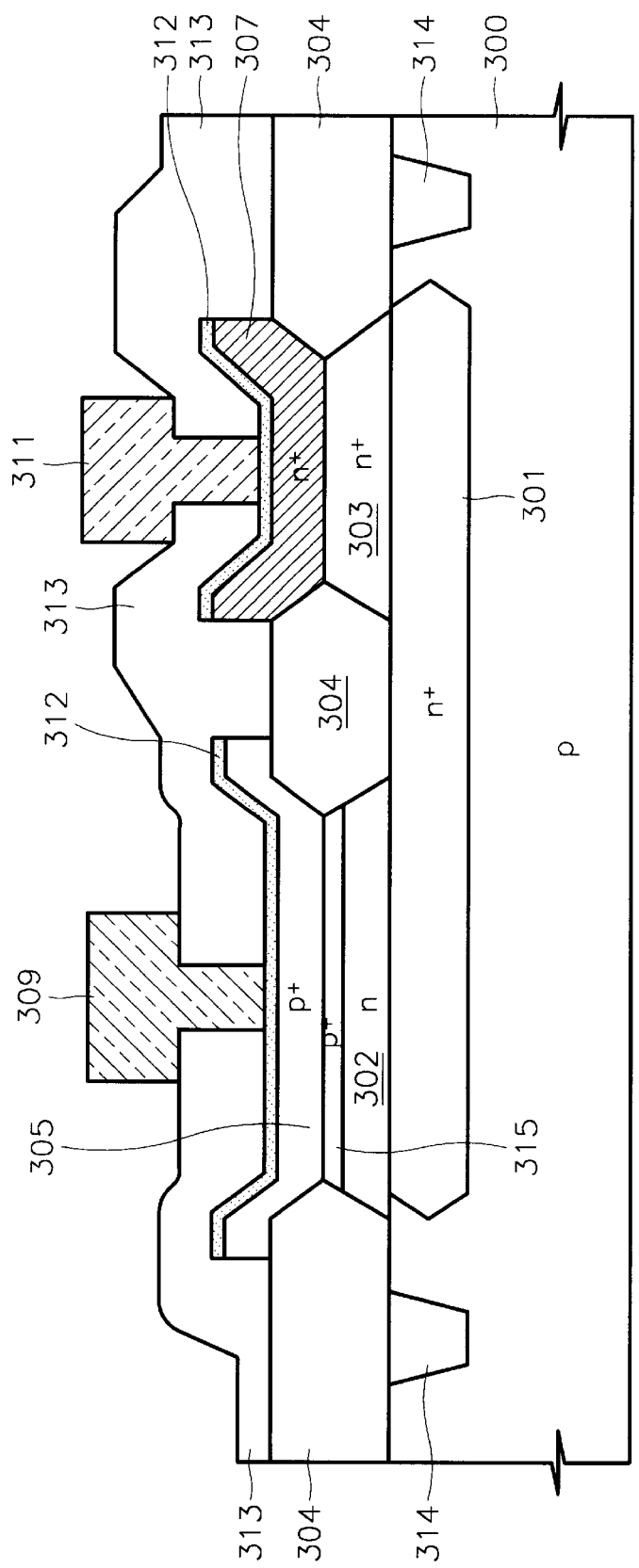
FIG. 3 is a sectional view of a varactor according to a first embodiment of the present invention.

FIG. 3 is a sectional view of a varactor according to a first embodiment of the present invention. Referring to FIG. 3, an n$^+$-type buried collector region 301 is formed in the upper surface portion of a p-type semiconductor substrate 300. An n-type collector region 302 and an n$^+$-type collector contact region 303 are formed on the n$^+$-type buried collector region 301 such that they are separated by an isolation layer 304. A p$^+$-type external base region 315 is formed on the n-type collector region 302. A p$^+$-type silicon-germanium (SiGe) base region 305 is formed on the p$^+$-type external base region 315. A metal silicide layer 312 is formed on the p$^+$-type SiGe base region 305. A first metal layer 309 used as an anode electrode is formed on a partial surface of the metal silicide layer 312 such that it is electrically connected to the p+-type SiGe base region 305 through the metal silicide layer 312.

An n+-type polysilicon layer 307 used as a collector conductive layer is formed on the n+-type collector contact region 303. The metal silicide layer 312 is also formed on the n+-type polysilicon layer 307. A second metal layer 311 used as a cathode electrode is formed on a partial surface of the metal silicide layer 312 such that it is electrically connected to the n-type collector region 302 through the metal silicide layer 312, the n+-type collector conductive layer 307, the n+-type collector contact region 303, and the n+-type buried collector region 301. The first metal layer 309 and the metal silicide layer 312 contacting the first metal layer 309 are electrically insulated from the second metal layer 311 and the metal silicide layer 312 contacting the second metal layer 311 by an insulation layer 313. Reference numeral 314 denotes an impurity region for isolating devices.

In such a varactor, an emitter region is eliminated from a SiGe heterojunction bipolar transistor (HBT) structure, and the first metal layer 309 used as an anode electrode directly contacts the p+-type SiGe base region 305, so a separate base contact region is unnecessary. Accordingly, the p+-type SiGe base region 305 does not need to be long. As a result, a serial resistance component within the p+-type SiGe base region 305 decreases, thereby achieving the excellent Q-factor. Moreover, when a plurality of varactors are implemented in a multi-finger structure, parasitic capacitance due to a conventional base contact region is removed, thereby improving the intrinsic capacitance variation of the varactor.

Figure 4:
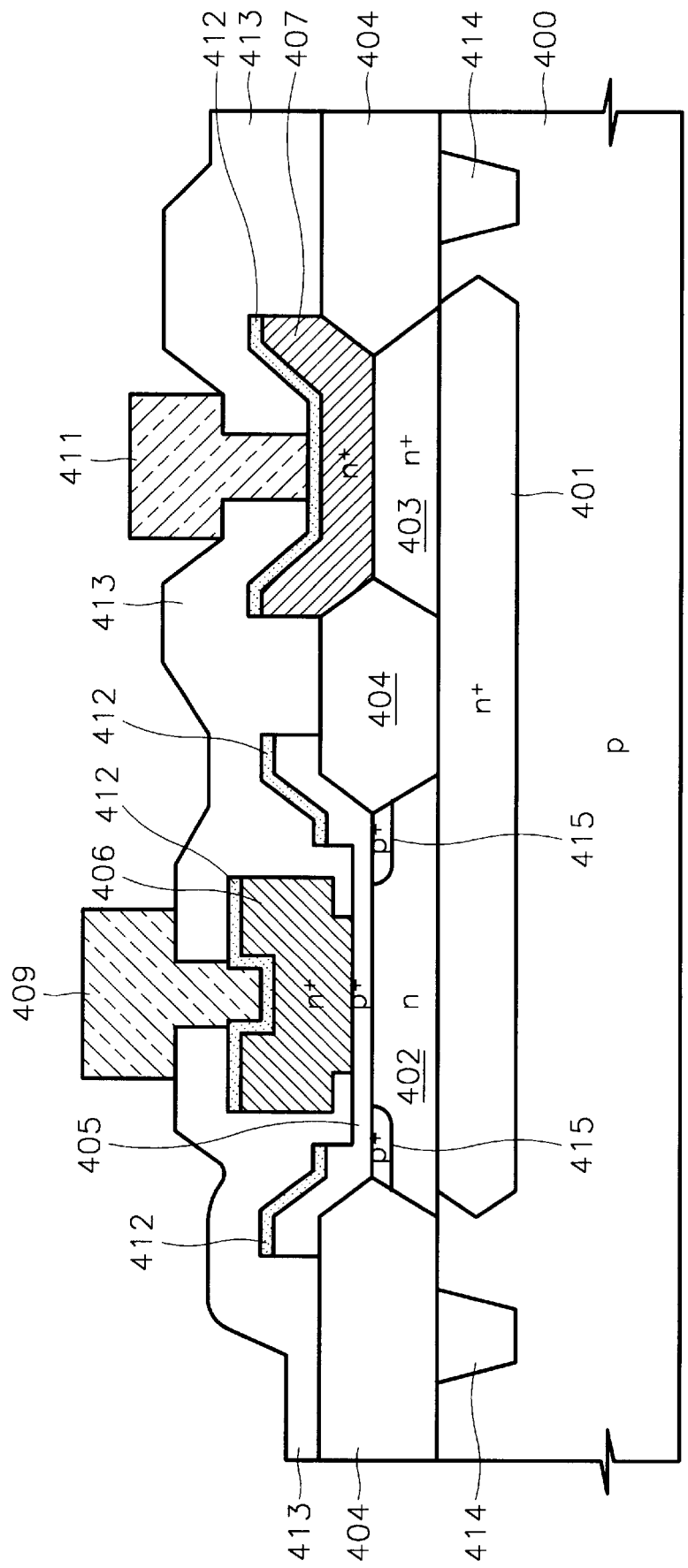
FIG. 4 is a section view of a varactor according to a second embodiment of the present invention.

FIG. 4 is a section view of a varactor according to a second embodiment of the present invention. In contrast to the varactor according to the first embodiment in which the first metal layer 309 for a base junction may influence a base-collector junction, the varactor according to the second embodiment has a structure in which a doped polysilicon layer is interposed between a first metal layer and a base region in order to remove the influence.

More specifically, an n+-type buried collector region 410 is formed in the upper surface portion of a p-type semiconductor substrate 400. An n-type collector region 402 and an n+-type collector contact region 403 are formed on the n+-type buried collector region 401 such that they are separated by the isolation layer 404. A p+-type external base region 415 is formed in a predetermined upper region of the n-type collector region 402. A p+-type SiGe base region 405 is formed on the p+-type external base region 415 and the n-type collector region 402. A conductive layer 406 doped with n+-type impurities and a metal silicide layer 412 are sequentially formed on the p+-type SiGe base region 405. A first metal layer 409 used as an anode electrode is formed on a partial surface of the metal silicide layer 412 such that it is electrically connected to the p+-type SiGe base region 405 through the metal silicide layer 412 and the conductive layer 406.

An n+-type polysilicon layer 407 used as a collector conductive layer is formed on the n+-type collector contact region 403. The metal silicide layer 412 is also formed on the n+-type polysilicon layer 407. A second metal layer 411 used as a cathode electrode is formed on a partial surface of the metal silicide layer 412 such that it is electrically connected to the n-type collector region 402 through the metal silicide layer 412, the n+-type collector conductive layer 407, the n+-type collector contact region 403, and the n+-type buried collector region 401. The first metal layer 409 and the metal silicide layer 412 contacting the first metal layer 409 are electrically insulated from the second metal layer 411 and the metal silicide layer 412 contacting the second metal layer 411 by an insulation layer 413. Reference numeral 414 denotes an impurity region for isolating devices.

Such a varactor has an improved Q-factor like the varactor according to the first embodiment and eliminates the influence of the first metal layer 409 on a base-collector junction because the conductive layer 406 acting as a buffer is interposed between the first metal layer 409 and the p+-type SiGe base region 405.

Figure 1:
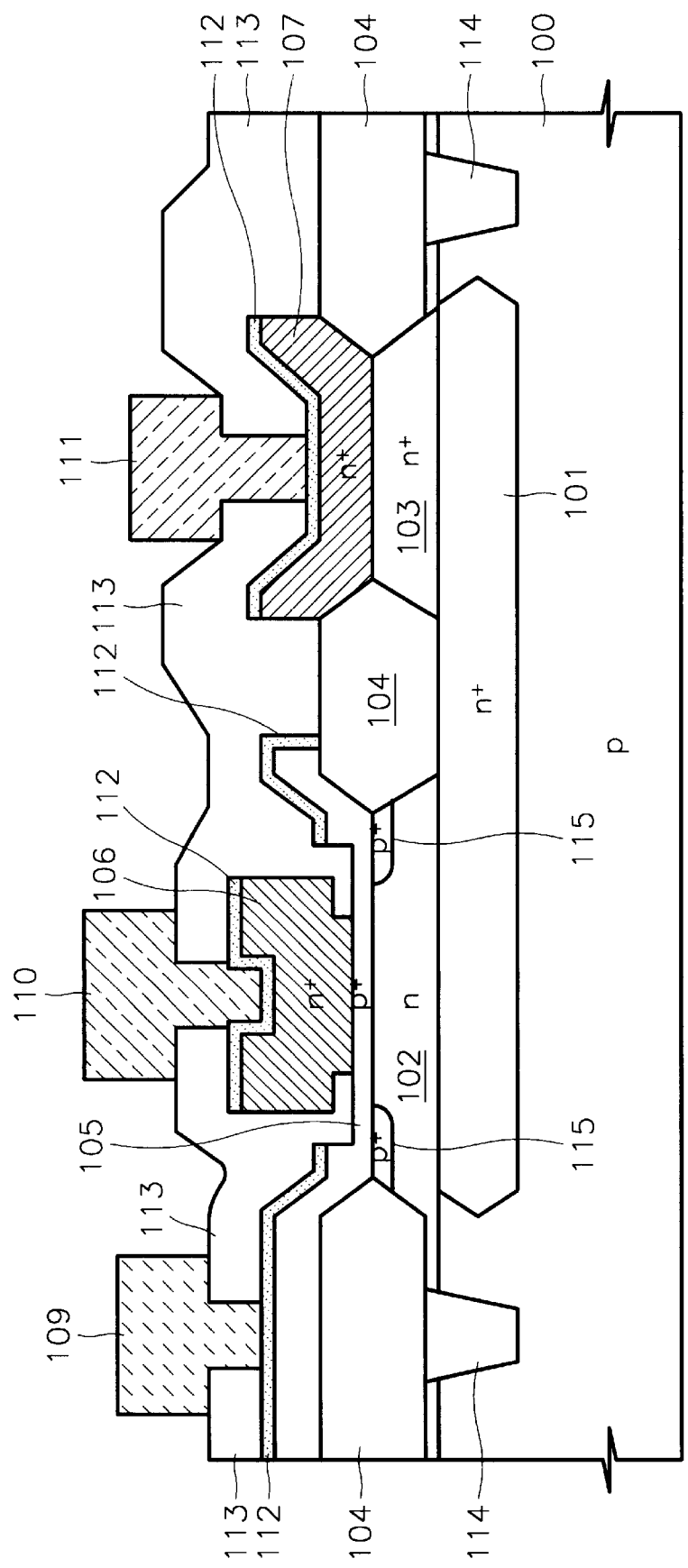
FIG. 1 is a sectional view of a typical silicon-germanium (SiGe) heterojunction bipolar transistor (HBT), particularly, a typical self-alignment type SiGe HBT.
Figure 2:
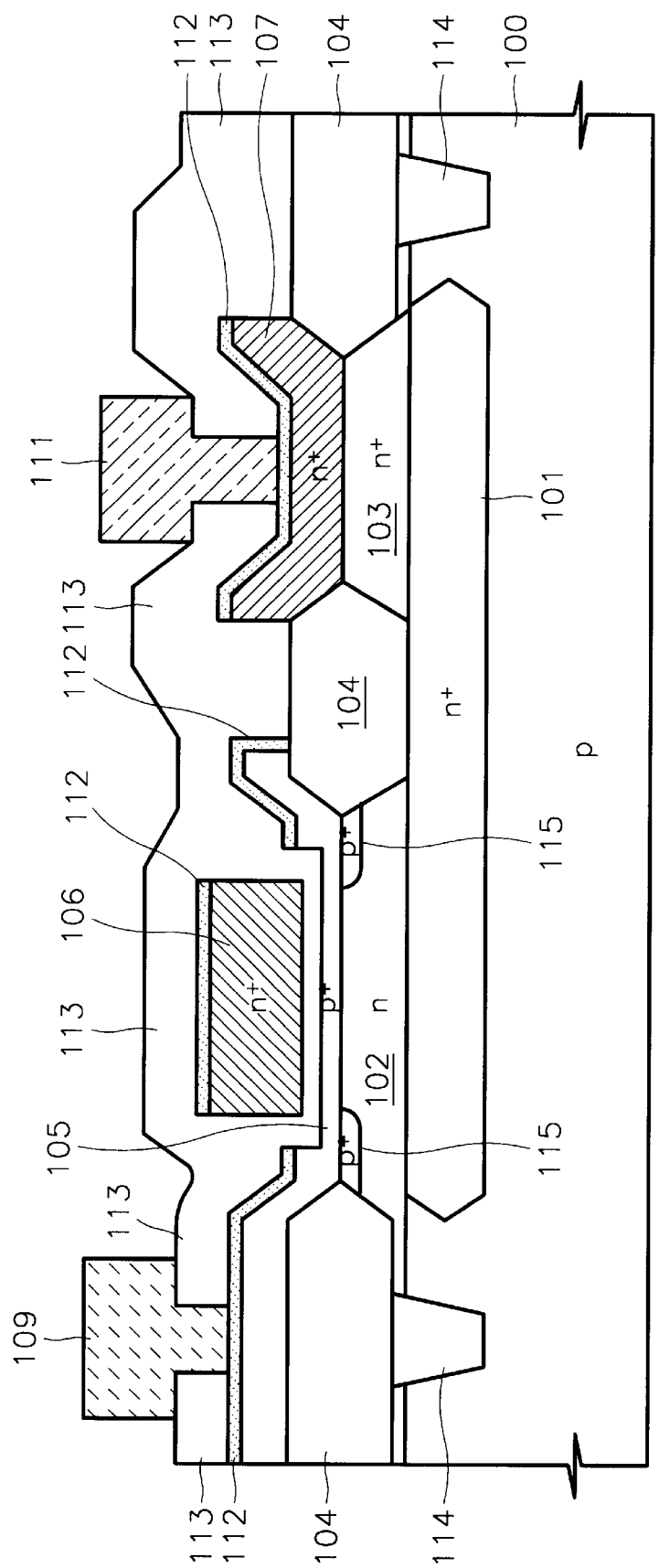
FIG. 2 is a sectional view of a varactor using the self-alignment type SiGe HBT of FIG. 1.
Figure 5:
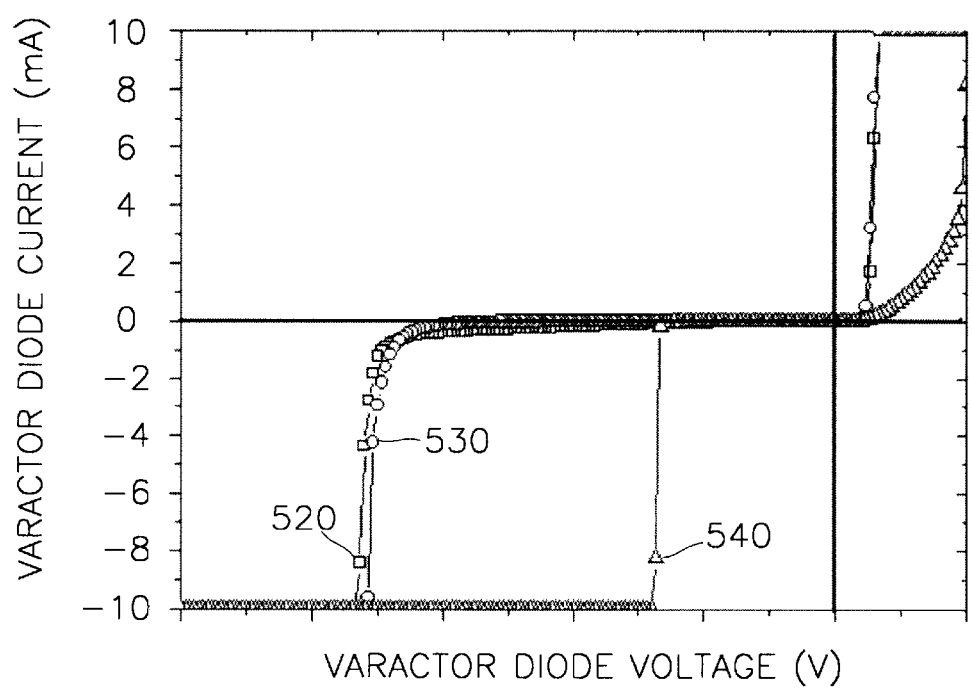
FIG. 5 is a graph showing the diode voltage-current characteristics of the respective varactors of FIGS. 2, 3, and 4.

FIG. 5 is a graph showing the diode voltage-current characteristics of the respective varactors of FIGS. 2, 3, and 4. Particularly, the graph shows direct current (DC) characteristics.

As shown in FIG. 5, the varactor of FIG. 2 denoted by 520 and the varactor of FIG. 3 denoted by 530 have similar DC characteristics. In the case of the varactor of FIG. 4 denoted by 540, a breakdown voltage is generated at a relatively lower voltage, but this does not cause a problem since the breakdown voltage is generated at a voltage higher than a usual operating voltage.

Figure 6:
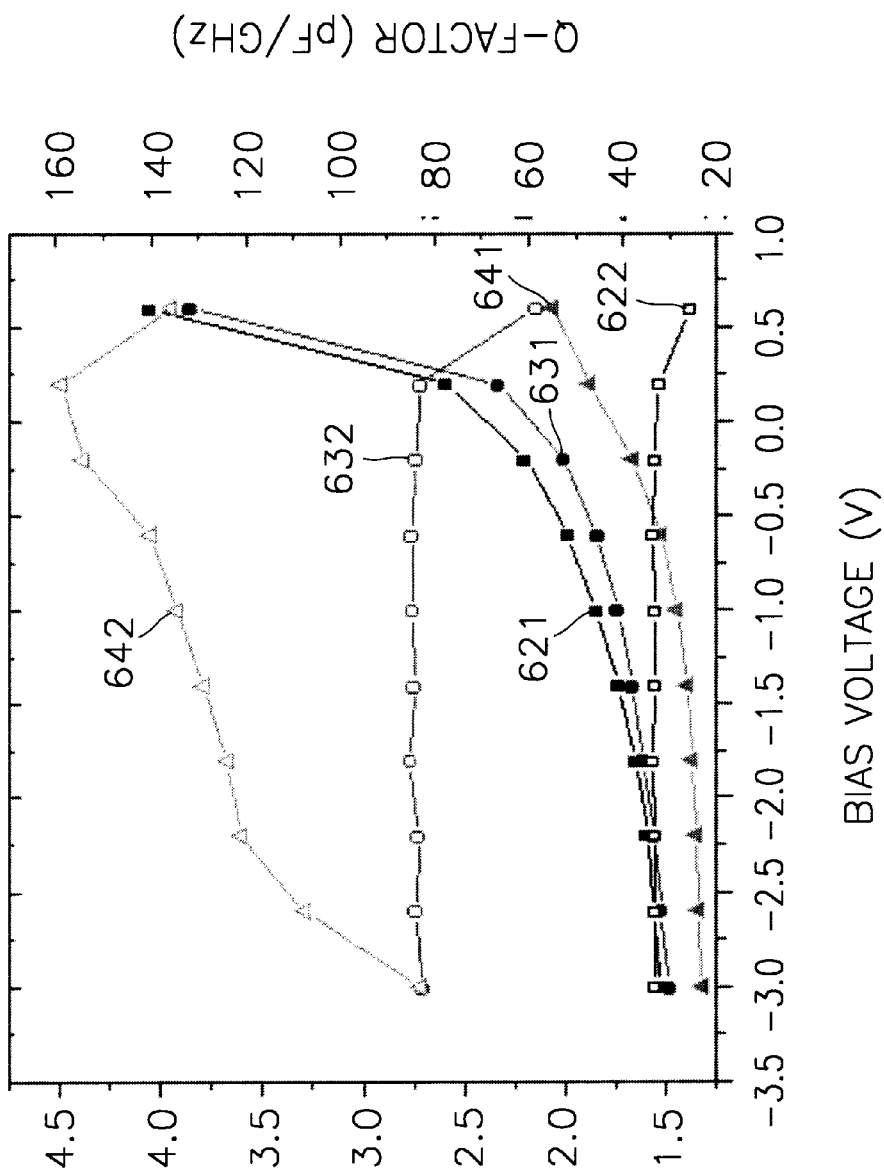
FIG. 6 is a graphs showing a bias voltage versus capacitance and a Q-factor with respect to the respective varactors of FIGS. 2 through 4.

FIG. 6 is a graphs showing a bias voltage versus capacitance and a Q-factor with respect to the respective varactors of FIGS. 2 through 4. Particularly, the graphs shows alternating current (AC) characteristics. In FIG. 6, reference numeral 621 denotes capacitance with respect to the bias voltage of the varactor of FIG. 2, and reference numeral 622 denotes a Q-factor with respect to the bias voltage of the varactor of FIG. 2. Reference numeral 631 denotes capacitance with respect to the bias voltage of the varactor of FIG. 3, and reference numeral 632 denotes a Q-factor with respect to the bias voltage of the varactor of FIG. 3. Reference numeral 641 denotes capacitance with respect to the bias voltage of the varactor of FIG. 4, and reference numeral 642 denotes a Q-factor with respect to the bias voltage of the varactor of FIG. 4.

As shown in FIG. 6, the capacitance of the varactor of FIG. 3 is relatively less than that of the varactor of FIG. 2, and the capacitance of the varactor of FIG. 4 is relatively less than that of the varactor of FIG. 3. The varactor of FIG. 2 has a Q-factor of about 30, but the varactors of FIGS. 3 and 4 have improved Q-factors of 80 and 120, respectively, FIGS. 7 through 9 are sectional views of a varactor for explaining a method of fabricating the varactor according to a first embodiment of the present invention.

Figure 7:
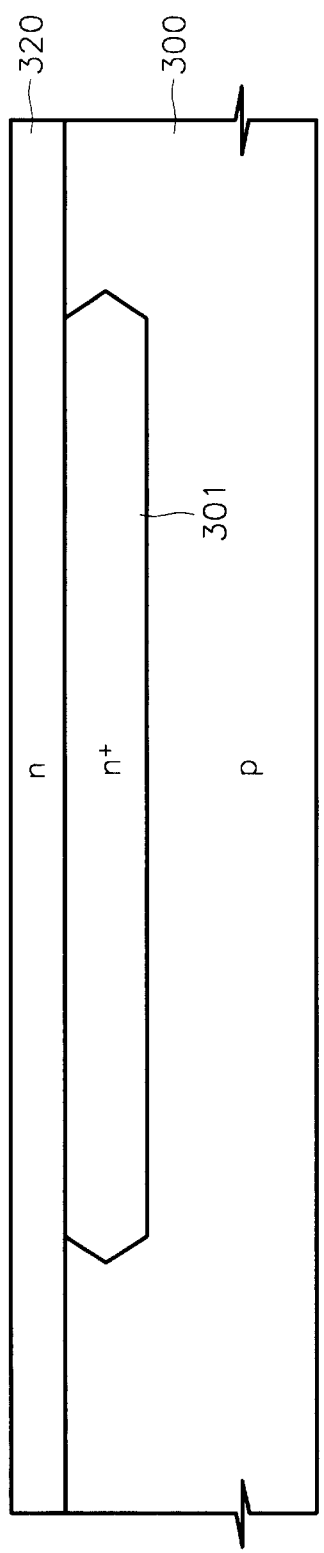
FIGS. 7 through 9 are sectional views of a varactor for explaining a method of fabricating the varactor according to a first embodiment of the present invention.

Referring to FIG. 7, a region for a buried collector region is exposed using a mask layer pattern, for example, a photoresist layer pattern, on a p-type semiconductor substrate 300. Next, impurity ions, for example, n-type impurity ions such as arsenic (As) ions, are ion-implanted into the exposed region using the photoresist layer pattern as an ion-implantation mask, and heat treatment is performed, thereby forming an n+-type buried collector region 301. Next, a collector epitaxial layer 320 which does not contain impurity ions is formed on the p-type semiconductor substrate 300 having the n+-type buried collector region 310. Thereafter, n-type impurity ions are implanted into the collector epitaxial layer 320.

Figure 8:
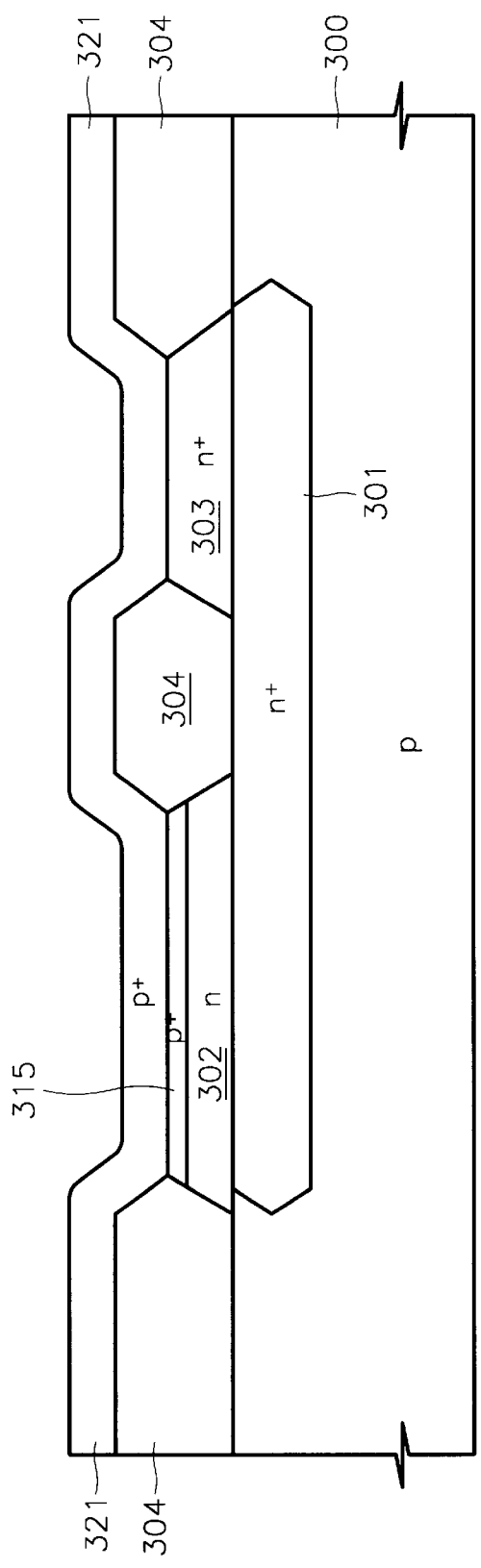

Referring to FIG. 8, a nitride layer pattern (not shown) is formed on the collector epitaxial layer 320, and thermal oxidation is then performed, thereby forming an isolation layer 304 of a local oxidation of silicon (LOCOS) layer on a portion other than regions in which an n-type collector region 302 and an n⁺-type collector contact region 303, i.e., active regions, are to be formed, respectively. Next, the nitride layer pattern is removed. Only the region, in which the n⁺-type collector contact region 303 is to be formed, is exposed using a mask layer pattern (not shown), and n-type impurity ions are implanted into the exposed region, thereby forming the n⁺-type collector contact region 303 on a partial surface of the n⁺-type buried collector region 301. Next, only the n-type collector region 302 is exposed using a mask layer pattern (not shown), and p-type impurity ions are implanted into the n-type collector region 302, thereby forming a p⁺-type external base region 315 on the n-type collector region 302. Next, a SiGe base epitaxial layer 321 into which p-type impurity ions are implanted at high concentration is formed on the entire surface of the p-type semiconductor substrate 300.

Figure 9:
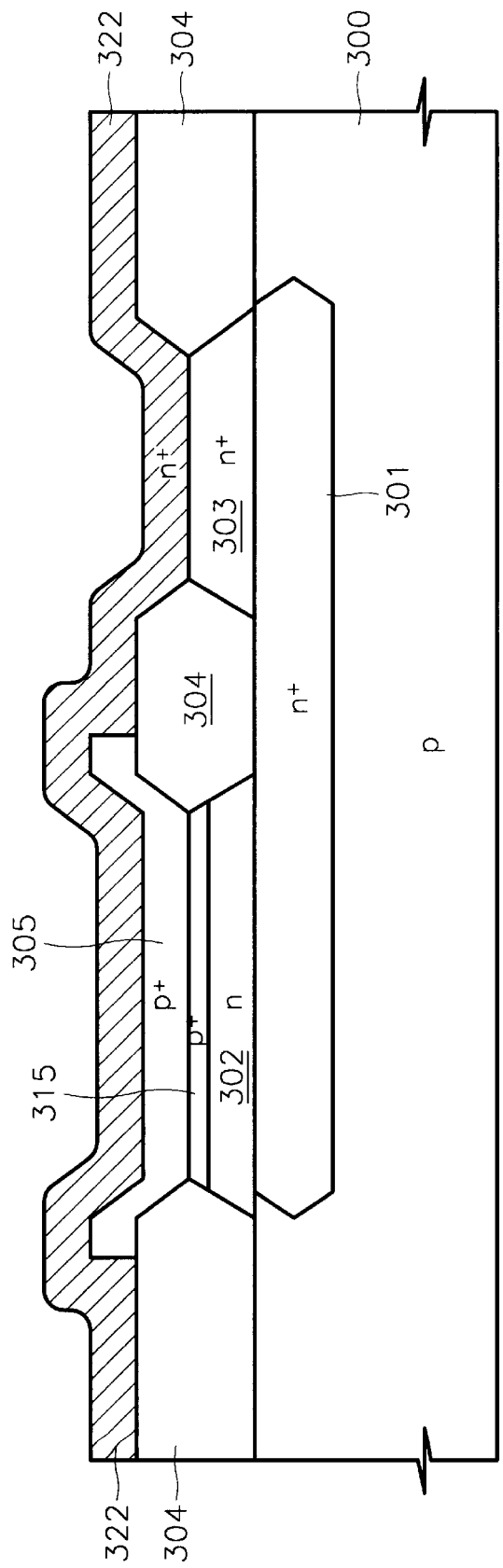

Referring to FIG. 9, a portion of the p⁺-type SiGe base epitaxial layer 321 other than a portion of the p⁺-type SiGe base epitaxial layer 321 on the p⁺-type external base region 315 is removed, thereby forming a p⁺-type SiGe base region 305. Next, a polysilicon layer 322 doped with n⁺-type impurity ions is formed on the entire surface of the p-type semiconductor substrate 322.

Referring to FIG. 3, a portion of the polysilicon layer 322 other than a portion of the polysilicon 322 on the n⁺-type collector contact region 303 is removed, thereby forming an n⁺-type polysilicon layer 307 as a collector conductive layer. Next, a typical silicide process is performed, thereby forming a metal silicide layer 312 on the p⁺-type SiGe base region 305 and the n⁺-type collector contact region 303. Next, an insulation layer 313 is formed on the entire surface of the p-type semiconductor substrate 300. Subsequently, the insulation layer 313 is partially etched, thereby forming a first contact hole partially exposing the surface of the metal silicide layer 312 on the p⁺-type SiGe base region 305 and a second contact hole partially exposing the surface of the metal silicide layer 312 on the n⁺-type polysilicon layer 307. Next, a first metal layer 309 filling the first contact hole and a second metal layer 311 filling the second contact hole are formed. The first metal layer 309 is used as an anode electrode of the varactor and the second metal layer 311 is used as a cathode electrode of the varactor.

Figure 12:
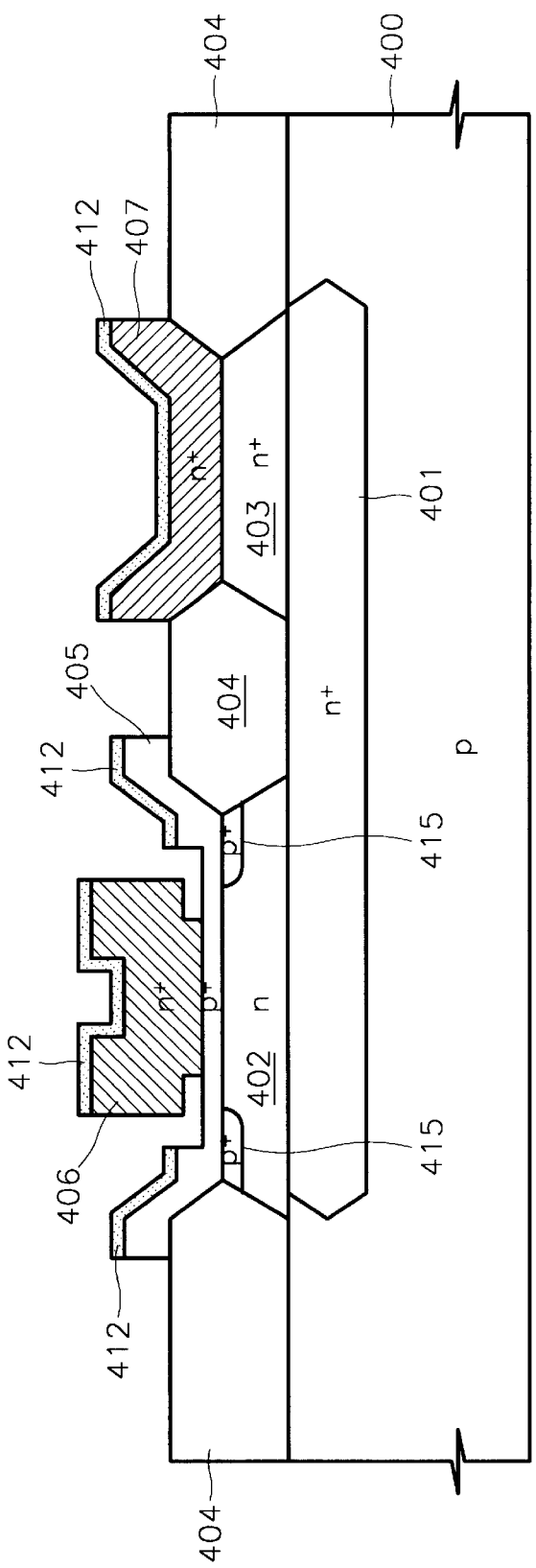

FIGS. 10 through 12 are sectional views of a varactor for explaining a method of fabricating the varactor according to a second embodiment of the present invention.

Referring to FIG. 10, a region for a buried collector region is exposed using a mask layer pattern, for example, a photoresist layer pattern, on a p-type semiconductor substrate 400. Next, impurity ions, for example, n-type impurity ions such as arsenic (As) ions, are ion-implanted into the exposed region using the photoresist layer pattern as an ion-implantation mask, and heat treatment is performed, thereby forming an n⁺-type buried collector region 401. Next, a collector epitaxial layer 420 which does not contain impurity ions is formed on the p-type semiconductor substrate 400 having the n⁺-type buried collector region 410. Thereafter, n-type impurity ions are implanted into the collector epitaxial layer 420.

Referring to FIG. 11, a nitride layer pattern (not shown) is formed on the collector epitaxial layer 420, and thermal oxidation is then performed, thereby forming an isolation layer 304 of a LOCOS layer on a portion other than regions in which a collector region 402 and a collector contact region 403, i.e., active regions, are to be formed, respectively. Next, the nitride layer pattern is removed. Only the region, in which the collector contact region 403 is to be formed, is exposed using a mask layer pattern (not shown), and n-type impurity ions are implanted into the exposed region, thereby forming the n⁺-type collector contact region 403 on a partial surface of the n⁺-type buried collector region 401. Next, a p⁺-type SiGe base epitaxial layer 421 into which p-type impurity ions are implanted at a high concentration is formed on the entire surface of the substrate 400. Subsequently, a nitride layer pattern 422 is formed on the p⁺-type SiGe base epitaxial layer 421. The nitride layer pattern 422 has an opening which partially exposes the surface of the p⁺-type SiGe base epitaxial layer 421. Next, a conductive layer 406 filling the opening of the nitride layer pattern 422 is formed. The conductive layer 406 is formed using an n⁺-type polysilicon layer pattern.

Referring to FIG. 12, the nitride layer pattern 422 is removed, and the p⁺-type SiGe base epitaxial layer 421 is partially removed, thereby forming a p⁺-type SiGe base region 405 connected to the surface of the n-type collector region 402. Although not shown in FIG. 12, a spacer may be formed on the sidewall of the conductive layer 406 after the nitride layer pattern 22 is removed. Next, an n⁺-type polysilicon layer 407 is formed as a collector conductive layer on the surface of the n⁺-type collector contact region 403. Subsequently, ion-implantation using a predetermined mask layer pattern (not shown) is performed, thereby forming a p⁺-type external base region 145 in the upper portion of the n-type collector region 402. Next, a typical silicide process is performed, thereby forming a metal silicide layer 412 on a partial surface of the p⁺-type SiGe base region 405, on the surface of the conductive layer 406, and on the surface of the n⁺-type polysilicon layer 407.

Referring to FIG. 4, an insulation layer 413 is formed on the entire surface of the p-type semiconductor substrate 400. Subsequently, the insulation layer 413 is partially etched, thereby forming a first contact hole which partially exposes the surface of the metal silicide layer 412 on the conductive layer 406 and a second contact hole which partially exposes the surface of the metal silicide layer 412 on the n⁺-type polysilicon layer 407. Next, a first metal layer 409 filling the first contact hole and a second metal layer 411 filling the second contact hole are formed. The first metal layer 409 is used as an anode electrode of the varactor and the second metal layer 411 is used as a cathode layer of the varactor.

As described above, according to a varactor having an improved Q-factor through a SiGe HBT, a collector electrode is formed at a position where an emitter region and an emitter electrode are formed in a general SiGe HBT structure, thereby reducing the length of a SiGe base region. Accordingly, resistance in the base region can be reduced, thereby providing an improved Q-factor. In addition, when a plurality of varactors are implemented in a multi-finger structure, parasitic capacitance due to a conventional base contact region is eliminated, thereby improving the variation of intrinsic capacitance of a varactor.

When a conductive layer acting as a buffer is interposed between a collector electrode and a base region, the collector electrode does not directly contact the base region, thereby eliminating bad influence of the collector electrode on a base-collector junction.

A method of fabricating a varactor according to the present invention has an advantage of easily fabricating a varactor having an excellent Q-factor using a typical HBT fabrication method.

What is claimed is:
1. A varactor comprising:
   a semiconductor substrate of a first conductivity type;

a high-concentration buried collector region of a second conductivity type formed in an upper portion of the semiconductor substrate;

a collector region of the second conductivity type formed on a first surface of the high-concentration buried collector region;

a high-concentration collector contact region of the second conductivity type formed on a second surface of the high-concentration buried collector region;

a high-concentration silicon-germanium base region of the first conductivity type formed on the collector region;

a metal silicide layer formed on the silicon-germanium base region;

a first electrode layer formed to contact the metal silicide layer; and a second electrode layer formed to be electrically connected to the collector contact region.

2. The varactor of claim 1, further comprising a high-concentration external base region of the first conductivity type formed between the collector region and the silicon-germanium base region.

3. A varactor comprising:

a semiconductor substrate of a first conductivity type;

a high-concentration buried collector region of a second conductivity type formed in an upper portion of the semiconductor substrate;

a collector region of the second conductivity type formed on a first surface of the high-concentration buried collector region;

a high-concentration collector contact region of the second conductivity type formed on a second surface of the high-concentration buried collector region;

a high-concentration silicon-germanium base region of the first conductivity type formed on the collector region;

a conductive layer formed on the silicon-germanium base region;

a metal silicide layer formed on the conductive layer;

a first electrode layer formed to contact the metal silicide layer; and a second electrode layer formed to be electrically connected to the collector contact region.

4. The varactor of claim 3, wherein the conductive layer is a polysilicon layer doped with impurity ions of the second conductivity type at a high concentration.

5. The varactor of claim 1 or 3, further comprising a collector conductive layer and a metal silicide layer which are formed between the collector contact region and the second electrode layer.

6. The varactor of claim 5, wherein the collector conductive layer is a polysilicon layer doped with impurity ions of the second conductivity type at a high concentration.

7. The varactor of claim 1 or 3, wherein the first conductivity type is a p type, and the second conductivity type is an n type.

* * * * *